United States Patent
Ozawa

(10) Patent No.: US 6,849,920 B2
(45) Date of Patent: Feb. 1, 2005

(54) SEMICONDUCTOR CAPACITIVE ELEMENT, METHOD FOR MANUFACTURING SAME AND SEMICONDUCTOR DEVICE PROVIDED WITH SAME

(75) Inventor: Ken Ozawa, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/421,482

(22) Filed: Apr. 23, 2003

(65) Prior Publication Data

US 2003/0201484 A1 Oct. 30, 2003

(30) Foreign Application Priority Data

Apr. 26, 2002 (JP) ........................................ 2002/127639

(51) Int. Cl.[7] ............................................... H01L 29/00
(52) U.S. Cl. ........................................ 257/532; 257/306
(58) Field of Search ................................. 257/306, 532

(56) References Cited

U.S. PATENT DOCUMENTS 6,300,682 B2 * 10/2001 Chen .......................... 257/758
6,387,775 B1 * 5/2002 Jang et al. .................... 438/396
6,391,707 B1 * 5/2002 Dirnecker et al. ........... 438/250
6,545,306 B2 * 4/2003 Kim et al. .................... 257/296
6,713,840 B1 * 3/2004 Lee et al. ..................... 257/535

FOREIGN PATENT DOCUMENTS

| EP | 1221715 A2 * | 7/2002 | ........... H01L/21/02 |
|---|---|---|---|
| JP | 2000-228497 | 8/2000 | |
| JP | 2001-274328 | 10/2001 | |
| JP | 2003-51501 | 2/2003 | |

* cited by examiner

*Primary Examiner*—Allan R. Wilson
(74) *Attorney, Agent, or Firm*—Scully, Scott, Murphy & Presser

(57) ABSTRACT

A semiconductor capacitor configured so as to use buried wirings, as electrodes, formed in an interlayer dielectric is provided on a semiconductor substrate which is capable of preventing an increase in a number of manufacturing processes with occurrence of parasitic capacity being suppressed. The semiconductor capacitor has a capacitive insulating film made up of an etching stopper film formed only in a region being sandwiched between a via plug serving as an upper electrode and a lower electrode, in which the capacitive insulating film is not formed in a region other than the facing region.

8 Claims, 15 Drawing Sheets layout of lower layer wirings (lower electrode)

layout of via plugs (upper electrode)

layout of upper layer wirings

SEMICONDUCTOR CAPACITIVE ELEMENT, METHOD FOR MANUFACTURING SAME AND SEMICONDUCTOR DEVICE PROVIDED WITH SAME

BACKGROUND OF THE INVENTION

1. Field of the Invention

The present invention relates to a semiconductor capacitive element, a method for manufacturing the same and a semiconductor device provided with the same, and more particularly to the semiconductor capacitive element using buried wirings formed in an interlayer dielectric on a semiconductor substrate as electrodes, the method for manufacturing the semiconductor capacitive element and the semiconductor device provided with the semiconductor capacitive element.

The present application claims priority of Japanese Patent Application No. 2002-127639 filed on Apr. 26, 2002, which is hereby incorporated by reference.

2. Description of the Related Art

In a semiconductor device typified by an LSI (Large Scale Integrated circuit), due to a change in a potential of a power source caused by reversing of a logical value occurring at a time of switching operations, a power source noise occurs. Such the power source noise affects a normal operation of the semiconductor device, causing a malfunction. Therefore, in order to reduce the power source noise, a semiconductor capacitive element (hereinafter may be referred to as a semiconductor capacitor) serving as a decoupling capacitor or a by-pass capacitor is generally formed and embedded in the semiconductor device.

On the other hand, as an integration degree of a recently-available LSI is heightened, dimensions of each semiconductor device are made more smaller and, as a result, dimensions of a semiconductor region making up each semiconductor device are also becoming smaller. When wirings being connected in such a small region of the semiconductor device are formed, since high wiring density corresponding to such the high integration degree cannot be obtained merely by forming wirings in a plane direction on a semiconductor substrate, multi-layer wiring technology is employed in which wirings are formed through multi-layers in a direction of a thickness on the semiconductor substrate.

Moreover, in such the LSIs as described above, since an operation speed of the semiconductor device is greatly influenced by a resistance of a wiring, it is desirable that the wiring having a low resistance is formed. From this viewpoint, in recent years, as a material for the wiring, instead of Al (aluminum) or Al metals containing Al as a chief ingredient, Cu (Copper) or Cu metals containing Cu as a chief ingredient, which has a resistance being lower than that of the Al or Al metals, tend to be widely used. However, when the wiring is formed by using Cu metals as its material, since a vapor pressure of a Cu compound is low, unlike in the case of using the Al metals, it is difficult to perform patterning on a Cu-based wiring so as to obtain a desired shape by using dry-etching technology. Therefore, to form the wiring having a desired shape by using Cu metals, so-called Damascene wiring method is employed in which a wiring trench is formed in an interlayer dielectric formed on the semiconductor substrate and a buried wiring is formed in the wiring trench. That is, in the Damascene wiring method, after Cu metals have been formed on entire surfaces of the interlayer dielectric including the wiring trench, unwanted Cu metal films formed on the interlayer dielectric are removed by using a CMP (Chemical Mechanical Polishing) method and the Cu metal film being left (buried) only in the wiring trench is used as the wiring. Moreover, a Dual Damascene wiring structure, as described later, obtained by further development of the Damascene wiring structure (hereinafter single Damascene wiring structure) is employed as a structure being suitable to multi-layer wiring technology in particular.

That is, according to the dual Damascene wiring method, after a via interlayer dielectric and an upper interlayer dielectric have been sequentially formed on the semiconductor substrate on which a lower layer wiring had been formed in advance, a via hole and an upper layer wiring trench are formed on each of the via interlayer dielectric and the upper interlayer dielectric, and then after Cu-metal films have been formed on entire surfaces of them, unwanted Cu-metal films are removed by using the CMP method in a manner that the Cu-metal films are left only within the via hole and the upper layer wiring trench to construct both a via plug and an upper layer wiring. Thus, a dual Damascene wiring structure is obtained in which the lower layer wiring is electrically connected to the upper layer wiring through the via plug. As described above, the dual Damascene wiring structure is superior to the single Damascene structure described above from viewpoints of cost reduction and high TAT (Turn-Around-Time) of LSIs achieved by simultaneous formation of the via plug and the upper layer wiring thereby enabling a decrease in a number of manufacturing processes. The larger the number of wiring layers, the higher its effects.

By using such the Damascene wiring method or the dual Damascene wiring method, a semiconductor capacitor serving as a decoupling capacitor as described above is generally embedded into the semiconductor device. For example, in Japanese Patent Application Laid-open No. 2000-228497, a semiconductor capacitor and its manufacturing method using the dual Damascene wiring method described above are disclosed. A semiconductor capacitor 120, as shown in FIG. 11, is so constructed that, on a substrate 100 on which lower components such as transistors (not shown) are formed, a first interlayer dielectric 102, a first etching stopper film (also called a cap film) 104, a second interlayer dielectric 106, a third interlayer dielectric 110, a second etching stopper film 112, and a fourth interlayer dielectric 114 are sequentially formed and that a lower electrode 108b is formed in such a manner as to be buried in the second interlayer dielectric 106 and that a dielectric film (capacity interlayer dielectric) 116 and an upper electrode 118b are formed in such a manner as to be sequentially buried in a first via hole h2 formed on the second etching stopper film 12 and the third interlayer dielectric 110.

Next, a method for manufacturing the conventional semiconductor capacitor is described in order of processes by referring to FIGS. 12A–12E.

First, as shown in FIG. 12A, the first interlayer dielectric 102 is formed on a substrate 100 on which lower components such as transistors (not shown) are formed. After the first etching stopper film 104 and the second interlayer dielectric 106 have been sequentially formed on the first interlayer dielectric 102, by using a photosensitive photoresist film (not shown) as a mask, the second interlayer dielectric 106 in a region corresponding to a multi-layer wiring forming portion 103 and in a region corresponding to a capacitor forming portion 105 is etched until a surface of the first etching stopper film 104 is exposed. Then, a part of the first etching stopper film 104 corresponding to the multi-layer wiring forming portion 103 and a part of the first interlayer dielectric 102 also corresponding to the multi-layer wiring forming portion 103 are etched until a surface of the substrate 100 is exposed to form a contact hole h1.

Next, as shown in FIG. 12B, after Cu-films have been formed on all surfaces of the second interlayer dielectric 106 and first etching stopper film 104 including the contact hole hi, by using the CMP method, the Cu-films are removed until the second interlayer dielectric 106 is exposed and then a first wiring line 108a is formed in a manner that the Cu-films are buried in a region corresponding to the multi-layer wiring forming portion 103 and, at a same time, a lower electrode 108b is formed in a manner that the Cu-films are buried in a region corresponding to the capacitor forming portion 105. Next, as shown in FIG. 12C, after the third interlayer dielectric 110, the second etching stopper film 112, and the fourth interlayer dielectric 114 have been sequentially formed on all surfaces of the second interlayer dielectric 106, the first wiring line 108a, and the lower electrode 108b, by using a photosensitive photo-resist film (not shown), the fourth interlayer dielectric 114 of a part corresponding to the multi-layer wiring forming portion 103 and of apart corresponding to the capacitor forming portion 105 is etched until a surface of the second etching stopper film 112 is exposed.

Then, as shown in FIG. 12D, by using a photosensitive film (not shown) as a mask, after the second etching stopper film 112 and the third interlayer dielectric 110 of a region corresponding to the capacitor forming portion 105 are etched until the lower electrode 108b is exposed to form a first via hole h2, a dielectric film 116 is formed on all surfaces of the fourth interlayer dielectric 114, the second etching stopper film 112, and the third interlayer dielectric 110 including the first via hole h2. Next, the dielectric film 116, the second etching stopper film 112, the third interlayer dielectric 110 of a region corresponding to the multi-layer wiring forming portion 103 are etched until a surface of the first wiring line 108a is exposed to form a second via hole h3. Then, as shown in FIG. 12E, after a Cu-film has been formed on all surfaces of the dielectric film 116, the second etching stopper film 112, the third interlayer dielectric 110 including the first via hole h2 and second via hole h3, by using the CMP method, the Cu-film is removed until the dielectric film 116 is exposed to form a second wiring line 118a in a manner that the Cu film is buried in a region corresponding to the multi-layer wiring forming portion 103 and, at a same time, to form the upper electrode 118b in a manner that the Cu film is buried in a region corresponding to the capacitor forming portion 105.

Thus, the semiconductor device 121 is manufactured by integrating a multilayer wiring 119 obtained by connecting the first wiring line 108a with the second wiring line 118a in the region corresponding to the multi-wiring forming portion 103 and a semiconductor capacitor 120 obtained by having the dielectric film 116 be interposed between the lower electrode 108b and the upper electrode 118b in the region corresponding to the capacitor forming portion 105 as shown in FIG. 11. It is, therefore, possible to make the semiconductor capacitor 120 operate as a decoupling capacitor in the semiconductor device 121.

However, the semiconductor capacitor 120 has a problem in that its parasitic capacity is large and the conventional method for manufacturing the semiconductor capacity also has a problem in that a large number of processes is required for manufacturing. That is, in the semiconductor capacitor 120 shown in FIG. 11, the dielectric film 116 extends not only to a portion facing the lower electrode 108b but also to side faces of the third interlayer dielectric 110 and the fourth interlayer dielectric 114 within the first via hole h2 and further a dielectric constant of the dielectric film 116 is larger than those of the third and fourth interlayer dielectrics 110 and 114. As a result, the dielectric film 116 formed on portions other than that facing the lower electrode 108b causes parasitic capacity to become large. Therefore, in a semiconductor device aiming at achieving high-speed operations in particular, its operational speed is affected by the existence of parasitic capacity. Moreover, in the conventional method of manufacturing the semiconductor capacitor 120 described above, as shown in FIG. 12D, a film forming process to form the dielectric film 116 is needed, which causes an increase in the number of manufacturing processes and in costs.

To solve this problem, in the case of a semiconductor capacitor and its manufacturing method by using the Dual Damascene wiring method described above, the semiconductor capacitor and its manufacturing method to suppress an occurrence of parasitic capacity are disclosed, for example, in Japanese Patent Application Laid-open No. 2001-274328. The disclosed semiconductor capacitor 148, as shown in FIG. 13, has a lower layer wiring 133 formed on a first interlayer dielectric 131 with an etching stopper film 132 being interposed between the first interlayer dielectric 131 and the lower layer wiring 133, a capacitive insulating film 134 formed within a second interlayer dielectric 139, and an upper electrode 137 also formed within the second interlayer dielectric 139 in which the upper electrode 137 is connected through via plugs 146 formed within the second interlayer dielectric 139 to an upper layer wiring 147 formed in an etching stopper film 140 and in a third interlayer dielectric 141. In the semiconductor capacitor 148, since the capacitive insulating film 134 is formed only on the lower layer wiring 133 serving as a lower electrode, the occurrence of parasitic capacity as described above can be suppressed.

Next, the method for manufacturing the semiconductor capacitor is described in order of processes by referring to FIGS. 14A to 14G. First, as shown in FIG. 14A, after an etching stopper film 132 and another interlayer dielectric (not shown) have been sequentially formed on a first interlayer dielectric 131, as shown in FIG. 14B, by using the Damascene wiring process, the lower layer wiring 133 is formed in a manner that a film made of a metal such as Cu is buried in a wiring trench (not shown) formed in the another interlayer dielectric (not shown). Next, as shown in FIG. 14C, after the capacitive insulating film 134 and an electrode material film 135 have been formed on the lower layer wiring 133, an unwanted portion of the electrode material film 135 is etched by using a photo-resist film 136 as a mask, the upper electrode 137 is formed as shown in FIG. 14D. Next, the second interlayer dielectric 139, the etching stopper film 140, and the third interlayer dielectric 141 are sequentially formed.

Then, as shown in FIG. 14E, the third interlayer dielectric 141, the etching stopper film 140, the second interlayer dielectric 139 are etched until the upper electrode 137 is exposed to form a via hole 142. Next, as shown in FIG. 14F, the third interlayer dielectric 141 and the etching stopper film 140 are etched until the second interlayer dielectric 139 is exposed to form a wiring trench 143 and, at a same time, until the via hole 142 is exposed to form a wiring trench 144. Then, as shown in FIG. 14G, a metal film 145 such as a Cu film is formed on all surfaces of the third interlayer dielectric 141, and the etching stopper film 140, and the second interlayer dielectric 139 including the wiring trenches 143 and 144. Next, by removing the metal film 145 until the third interlayer dielectric 141 is exposed using the CMP method, the metal film 145 is buried into the via hole 142 to form the via plugs 146 and, at a same time, by burying the metal film 145 into the wiring trenches 143 and 144 to manufacture a semiconductor capacitor 148 as shown in FIG. 13. Therefore, it is possible to have the semiconductor capacitor 148 operate as a decoupling capacitor.

In the semiconductor capacitor 148 and its manufacturing method disclosed in Japanese Patent Application Laid-open No. 2001-274328, though the occurrence of parasitic capacity in the semiconductor capacity can be suppressed, there still exists a problem of an increase in the number of manufacturing processes. That is, even in the method of manufacturing the semiconductor capacitor 148 disclosed in Japanese Patent Application Laid-open No. 2001-274328, as shown in FIG. 14C, since the film forming process to form the capacitive insulating film 134 is needed, like in the case of the manufacturing method disclosed in Japanese Patent Application Laid-open No. 2000-228497, the number of manufacturing processes increases and therefore increases in costs are unavoidable.

SUMMARY OF THE INVENTION

In view of the above, it is an object of the present invention to provide a semiconductor capacitor configured so as to use a buried wirings, as electrodes, formed in an interlayer dielectric which is capable of preventing an increase in a number of manufacturing processes with occurrence of parasitic capacity being suppressed, a method of manufacturing the semiconductor capacitor described above and a semiconductor device provided with the semiconductor capacitor described above.

According to a first aspect of the present invention, there is provided a semiconductor capacitive element using wirings buried in an interlayer dielectric on a semiconductor substrate as electrodes including:

a lower electrode being buried in a first interlayer dielectric formed on the semiconductor substrate;

an upper electrode being buried in a second interlayer dielectric formed via an etching stopper film on the first interlayer dielectric; and a capacitive insulating film made up of the etching stopper film being formed only in a region being sandwiched between the upper electrode and the lower electrode.

In the foregoing first aspect, a preferable mode is one wherein a thickness of the capacitive insulating film is smaller than that of the etching stopper film in the region being sandwiched between the first interlayer dielectric and the second interlayer dielectric.

Another preferable mode is one wherein a dielectric constant of the etching stopper film is larger than that of the second interlayer dielectric.

Still another preferable mode is one wherein a third interlayer dielectric is formed on the second interlayer dielectric and the upper electrode is connected to wirings buried in the third interlayer dielectric.

According to a second aspect of the present invention, there is provided a method for manufacturing a semiconductor capacitive element which uses wirings buried in an interlayer dielectric on a semiconductor substrate as electrodes, the method including:

a lower layer wiring trench forming process in which, after a first etching stopper film and a first interlayer dielectric have been sequentially formed on the semiconductor substrate, each of the first interlayer dielectric and the first etching stopper film in a first region corresponding to a multi-layer wiring forming portion and each of the first interlayer dielectric and the first etching stopper film in a second region corresponding to a capacitor forming portion on the semiconductor substrate are selectively etched to form first and second lower layer wiring trenches, a lower layer conductive film forming process of forming a lower layer wiring in the first lower layer wiring trench in the first region corresponding to the multi-layer wiring forming portion and, at a same time, of forming a lower electrode in the second lower layer wiring trench in the second region corresponding to the capacitor forming portion;

a via hole forming process in which, after a second etching stopper film and a second interlayer dielectric have been sequentially formed on the first interlayer dielectric, the second interlayer dielectric and the second etching stopper film in the first region corresponding to the multi-layer wiring forming portion are selectively etched to form a first via hole and, at a same time, the second interlayer dielectric in the second region corresponding to the capacitor forming portion is selectively etched to form a second via hole to allow the second etching stopper film to be exposed; and a via plug forming process of forming a first via plug in the first via hole in the first region corresponding to the multi-layer wiring forming portion and, at a same time, of forming a second via plug serving as an upper electrode in the second via hole in the second region corresponding to the capacitor forming portion.

In the foregoing second aspect, a preferable mode is one that wherein includes an etching stopper film thinning process in which, after the via hole forming process, the etching stopper film in a third region being sandwiched between the first interlayer dielectric and the second interlayer dielectric in the second region corresponding to the capacitor forming portion is made thin.

Another preferable mode is one that wherein further includes an upper layer wiring trench forming process in which, following the via plug forming process, after a third etching stopper film and a third interlayer dielectric have been sequentially formed on the second interlayer dielectric, the third interlayer dielectric and the third etching stopper film in the first region corresponding to the multi-layer wiring forming portion and the interlayer dielectric and the third interlayer dielectric and the third etching stopper film in the second region corresponding to the capacitor forming portion are selectively etched to form a first layer upper layer wiring trench and a second upper layer wiring trench respectively and an upper layer wiring forming process in which an upper layer wiring is formed both in the first upper layer wiring trench in the first region corresponding to the multi-layer wiring forming portion and in the second upper layer wiring trench in the second region corresponding to the capacitor forming portion.

According to a third aspect of the present invention, there is provided a method for manufacturing a semiconductor capacitive element which uses wirings buried in an interlayer dielectric on a semiconductor substrate as electrodes, the method including:

a lower layer wiring trench forming process in which, after a first etching stopper film and a first interlayer dielectric have been sequentially formed on the semiconductor substrate, each of the first interlayer dielectric and the first etching stopper film in a first region corresponding to a multi-layer wiring forming portion and each of the first interlayer dielectric and the first etching stopper film in a region corresponding to a capacitor forming portion on the semiconductor substrate are selectively etched to form a first lower layer wiring trench and a second lower layer wiring trenches, respectively;

a lower layer conductive film forming process of forming a lower layer wiring in the first lower layer wiring trench in the first region corresponding to the multi-layer wiring forming portion and at a same time, of forming a lower electrode in the second lower layer wiring trench in the second region corresponding to the capacitor forming portion;

an upper layer wiring trench forming process in which, after a second etching stopper film, a second interlayer dielectric, a third etching stopper film, and a third interlayer dielectric have been sequentially formed on the first interlayer dielectric, each of the third interlayer dielectric and the etching stopper film in the first region corresponding to the multi-layer wiring forming portion and each of the third interlayer dielectric and the etching stopper film in the second region corresponding to the capacitor forming portion are selectively etched to form a first upper layer wiring trench and a second upper layer wiring trench, respectively;

a via hole forming process of selectively etching the second interlayer dielectric and the second etching stopper film in the first region corresponding to the multi-layer wiring forming portion to form a first via hole so that the first via hole is connected to the first upper layer wiring trench, and selectively etching the second interlayer dielectric in the second region corresponding to the capacitor forming portion to allow the second etching stopper film to be exposed and to form a second via hole so that the second via hole is connected to the second upper layer wiring trench; and a conductive film forming process of simultaneously forming a first via plug and an upper layer wiring, respectively, in the first via hole and in the first upper layer wiring trench in the first region corresponding to the multi-layer wiring forming portion and, at a same time, of simultaneously forming a second via plug and an upper layer wiring, both being used as upper electrodes, respectively, in the second via hole and in the second upper layer wiring trench in the second region corresponding to the capacitor forming section.

In the foregoing third aspect, a preferable mode is one that wherein further includes an etching stopper film thinning process in which, after the via hole forming process, the etching stopper film in a third region being sandwiched between the first interlayer dielectric and the second interlayer dielectric in the second region corresponding to the capacitor forming portion is made thin.

According to a fourth aspect of the present invention, there is provided a semiconductor device provided with a semiconductor capacitive element using wirings buried in an interlayer dielectric on a semiconductor substrate as electrodes, the semiconductor capacitive element including:

a lower electrode being buried in a first interlayer dielectric formed on the semiconductor substrate;

an upper electrode being buried in a second interlayer dielectric formed via an etching stopper film on the first interlayer dielectric; and a capacitive insulating film made up of the etching stopper film being formed only in a region being sandwiched between the upper electrode and the lower electrode.

In the foregoing fourth aspect, a preferable mode is one wherein a thickness of the capacitive insulating film is smaller than that of the etching stopper film in the region being sandwiched between the first interlayer dielectric and the second interlayer dielectric.

Another preferable mode is one wherein a dielectric constant of the etching stopper film is larger than that of the second interlayer dielectric.

Still another preferable mode is one wherein a third interlayer dielectric is formed on the second interlayer dielectric and the upper electrode is connected to wirings buried in the third interlayer dielectric.

With the above configuration, since the semiconductor capacitor has a capacitive insulating film made up of an etching stopper film formed only in a region being sandwiched between an upper electrode and lower electrode, it is possible to suppress occurrence of parasitic capacity.

With another configuration, since an etching stopper film formed in advance is used as a capacitive insulating film, a process of forming the capacitive insulating film is not needed, a number of manufacturing processes does not increase and an increase in costs can be avoided. Therefore, in a configuration in which a buried wirings formed in an interlayer dielectric is used as electrodes, an increase in manufacturing processes can be prevented with occurrence in parasitic capacity being suppressed.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

Figure 1:
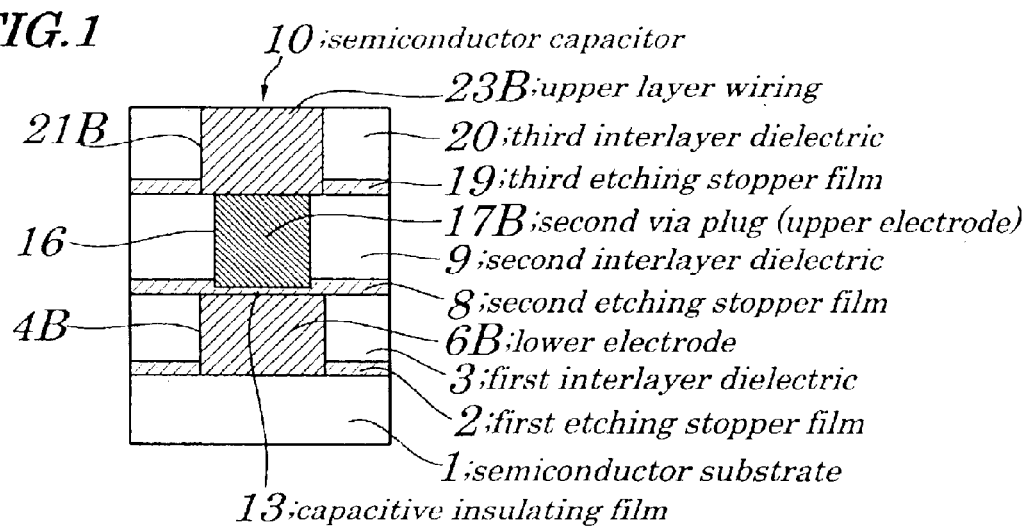
FIG. 1 is a cross-sectional view illustrating configurations of a semiconductor capacitor of an embodiment of the present invention.
Figure 2:
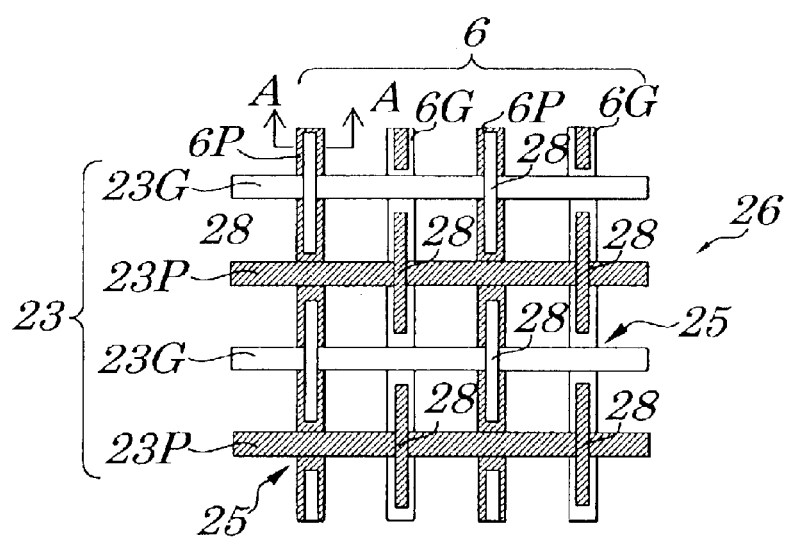
FIG. 2 is a top view schematically showing configurations of a semiconductor device in which the semiconductor capacitor is formed concurrently with multi-layer wirings according to the embodiment of the present invention.
Figure 3:
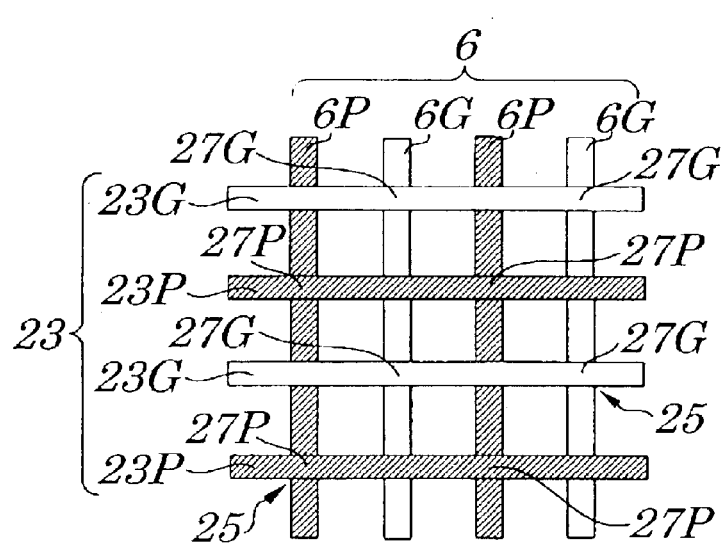
FIG. 3 is a top view schematically showing configurations of a semiconductor device (as a comparative example) in which the semiconductor capacitor is not formed.
Figure 4A:
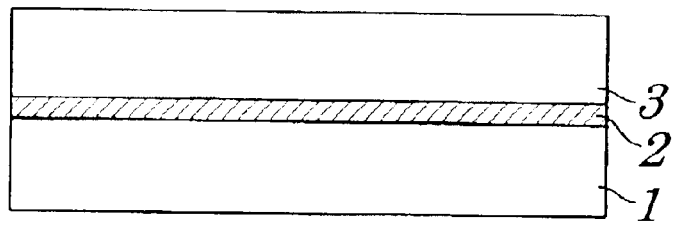
FIGS. 4A, 4B, 4C, 4D, 4E, 4F, 4G, 4H and 4I are process diagrams showing a first method of manufacturing the semiconductor capacitor in order of processes by using single Damascene wiring method.
Figure 4B:
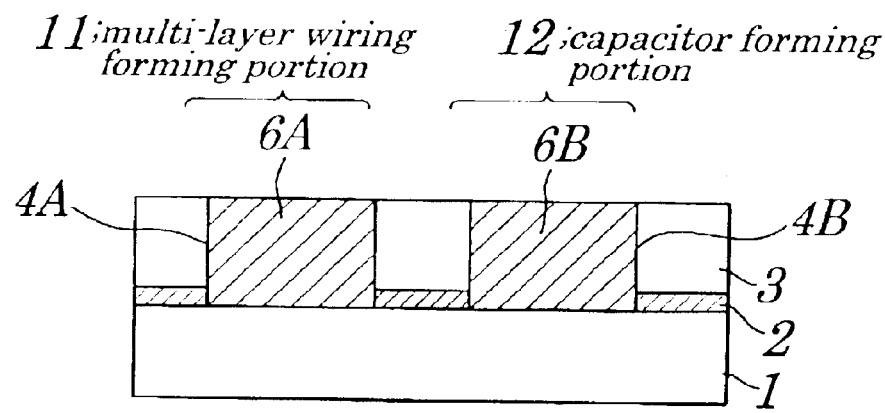
Figure 4C:
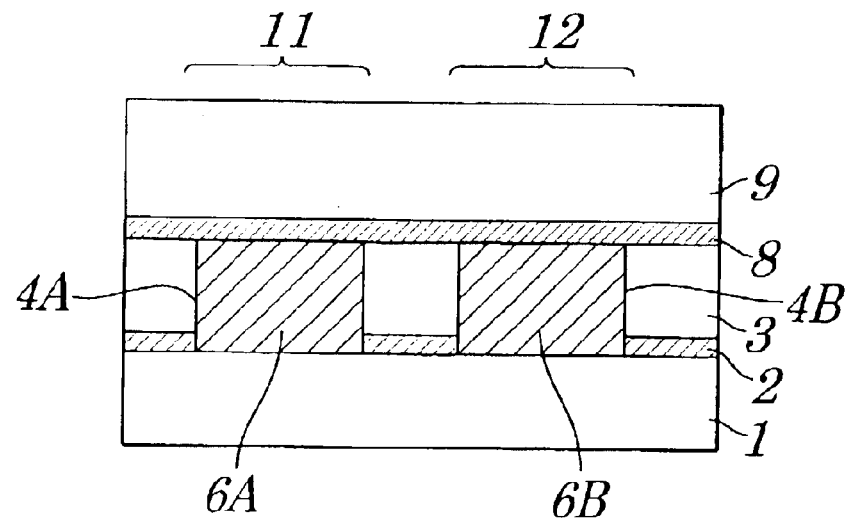
Figure 4D:
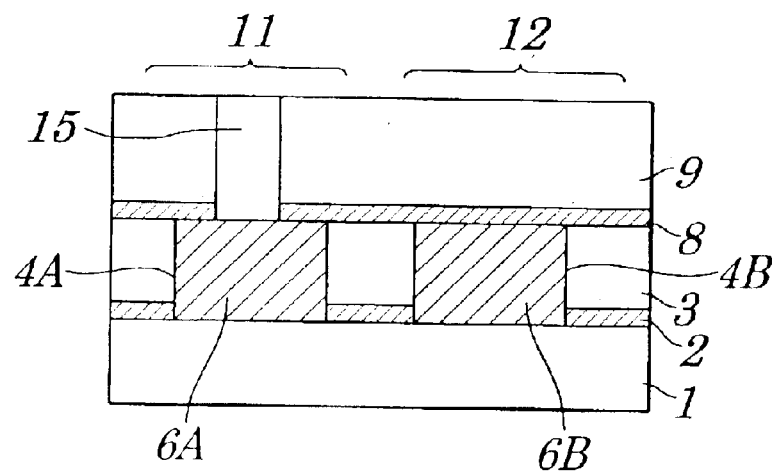
Figure 4E:
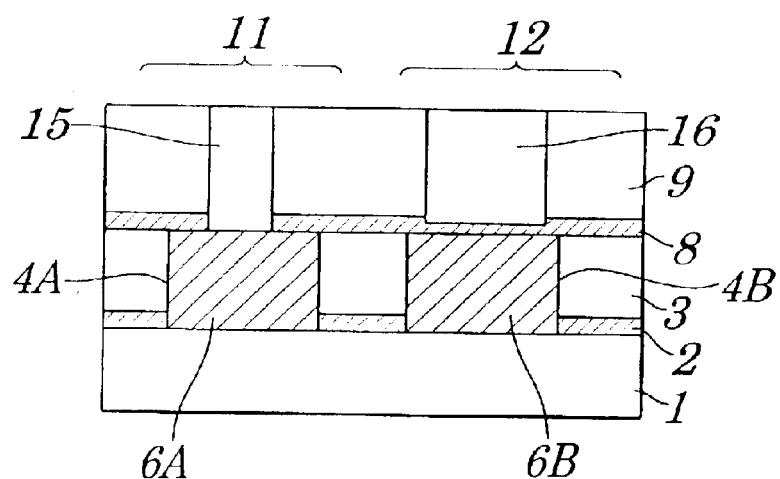
Figure 4F:
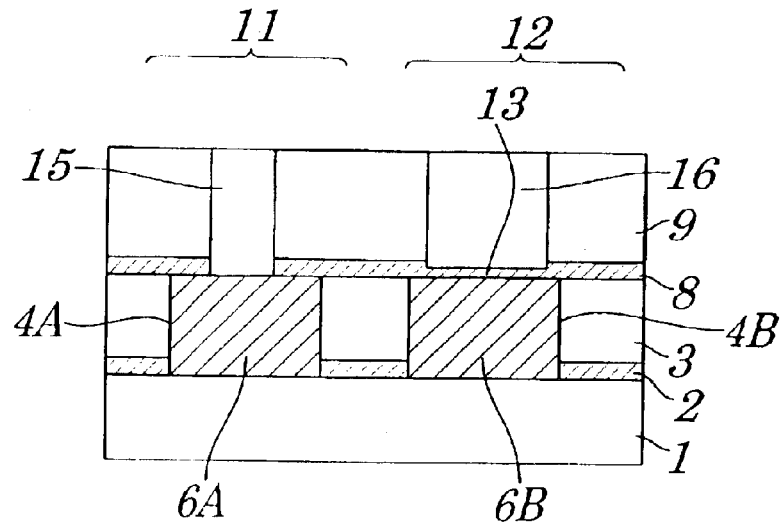
Figure 4G:
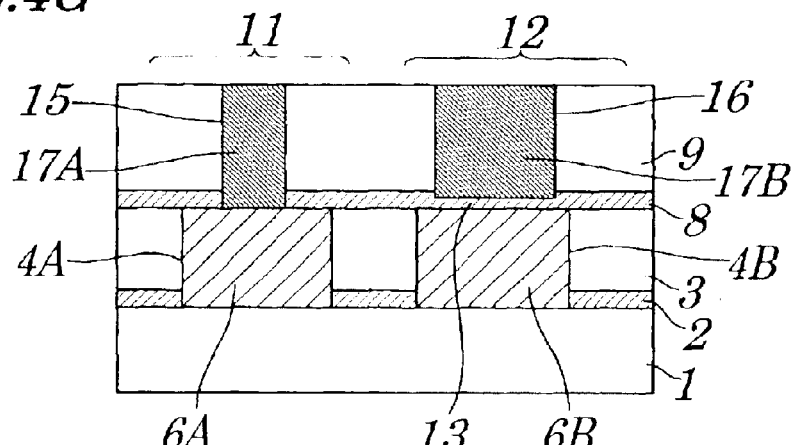
Figure 4H:
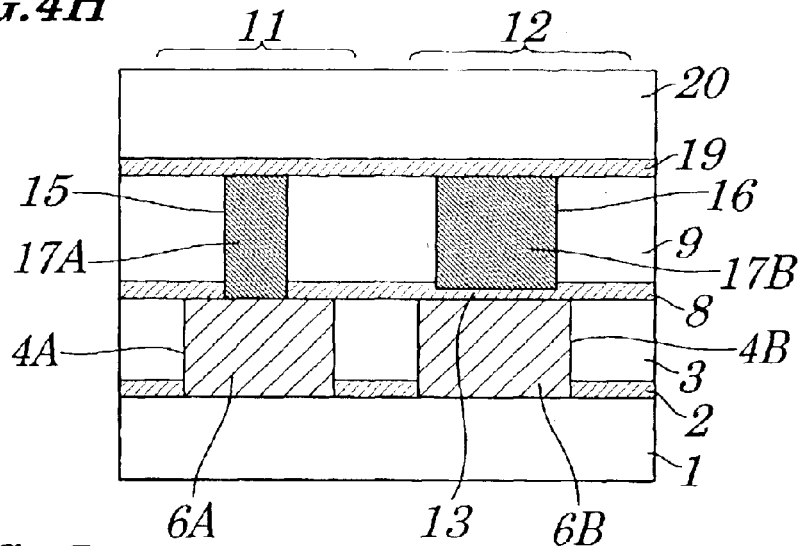
Figure 4I:
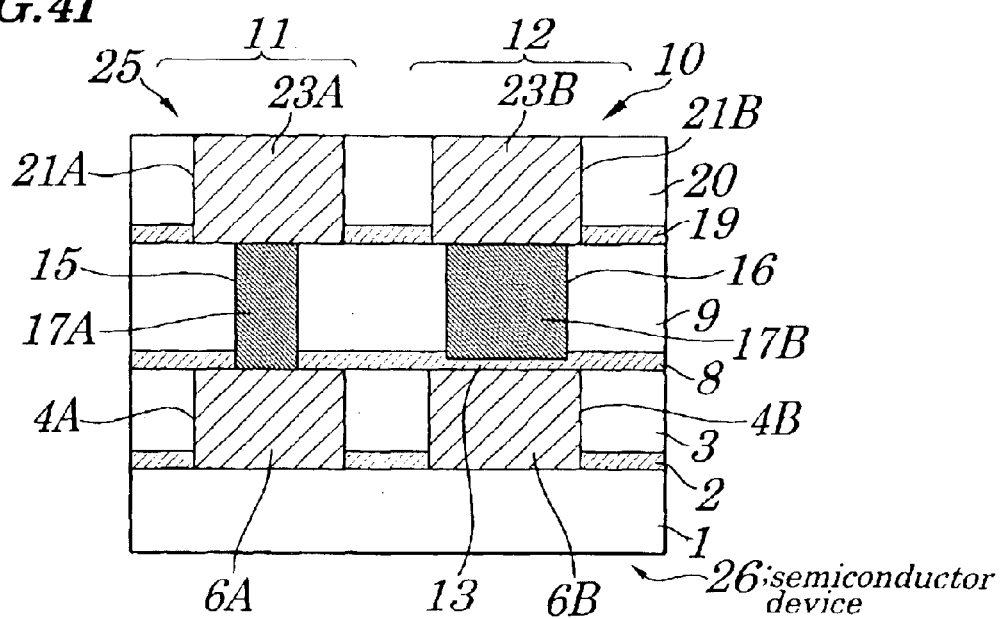
Figure 5A:
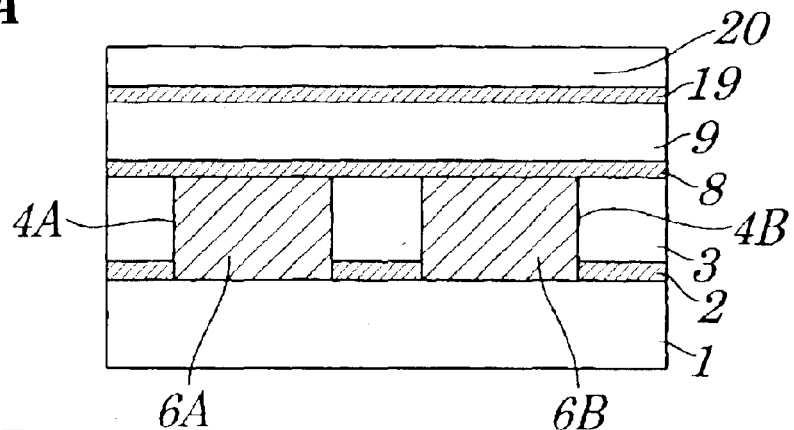
FIGS. 5A, 5B, 5C, 5D, 5E and 5F are process diagrams showing a second method of manufacturing the semiconductor capacitor in order of processes by using Dual Damascene wiring method.
Figure 5B:
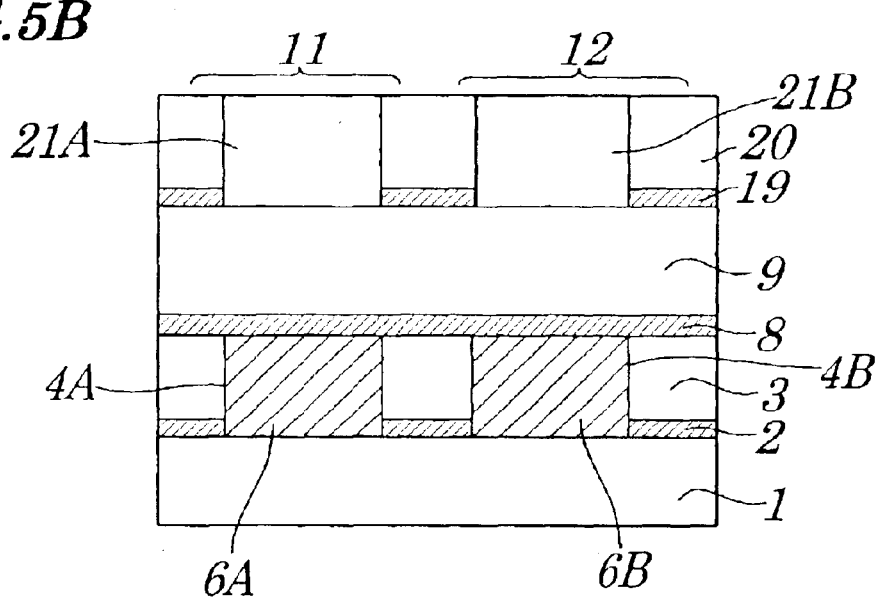
Figure 5C:
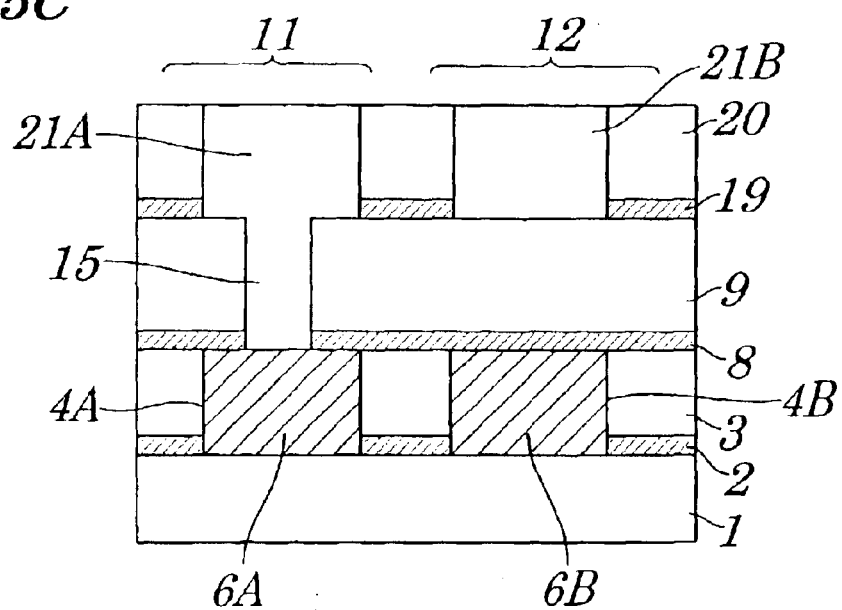
Figure 5D:
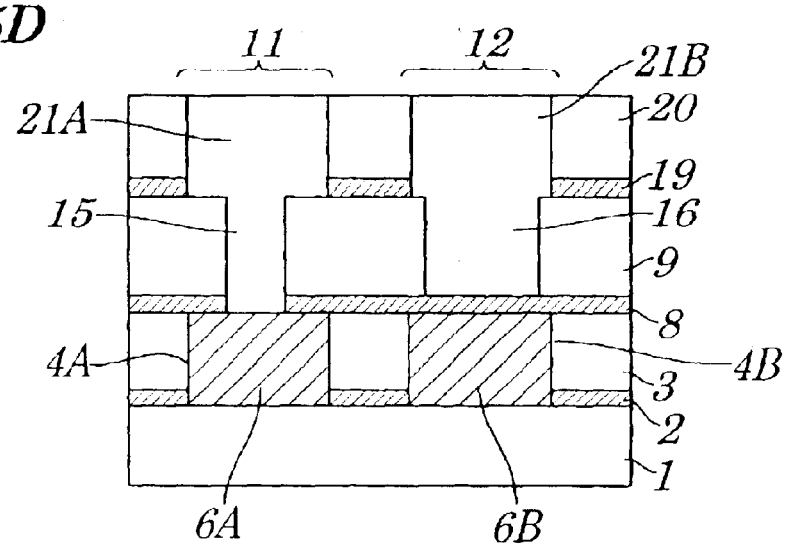
Figure 5E:
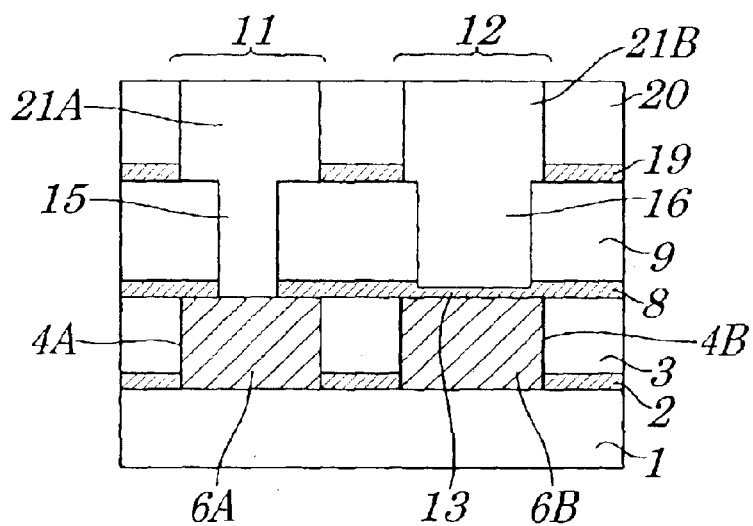
Figure 5F:
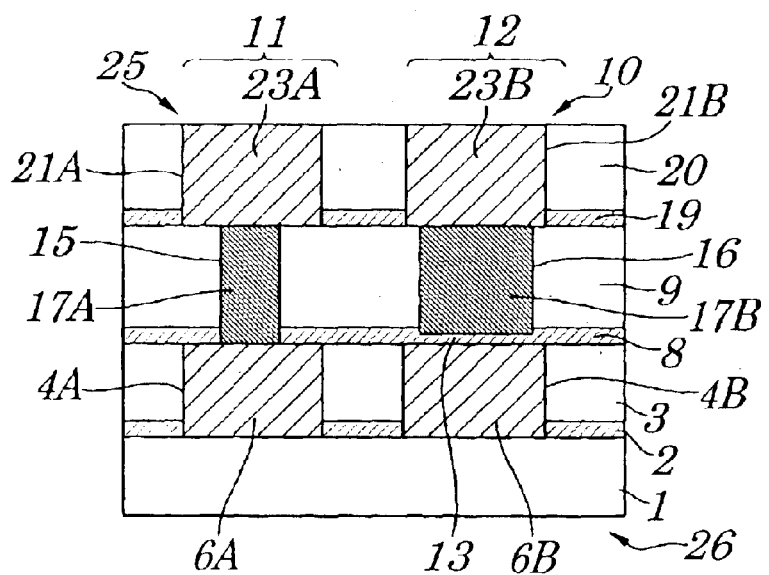
Figure 6A:
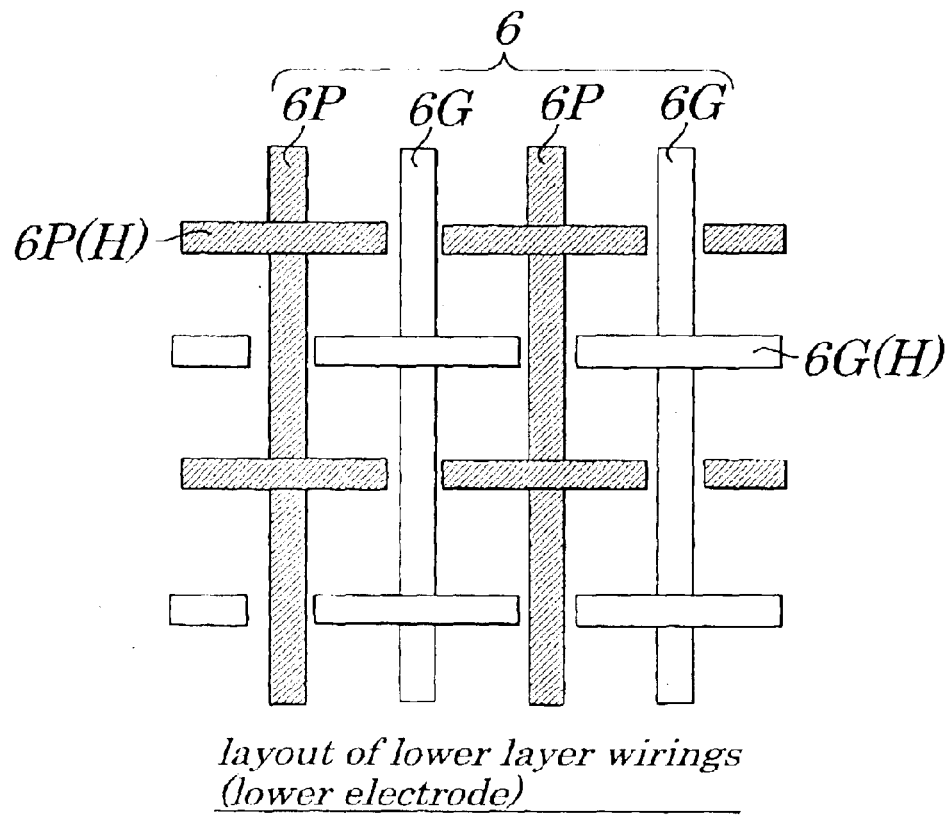
FIGS. 6A and 6B are top views showing a layout of conductive patterns making up a main component of the semiconductor device of the embodiment of the present invention.
Figure 6B:
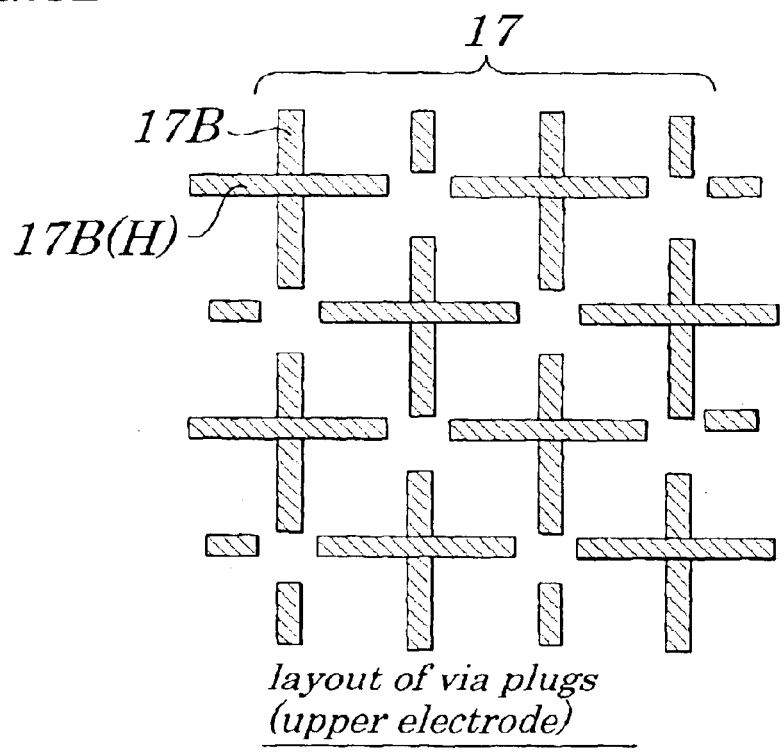
Figure 7:
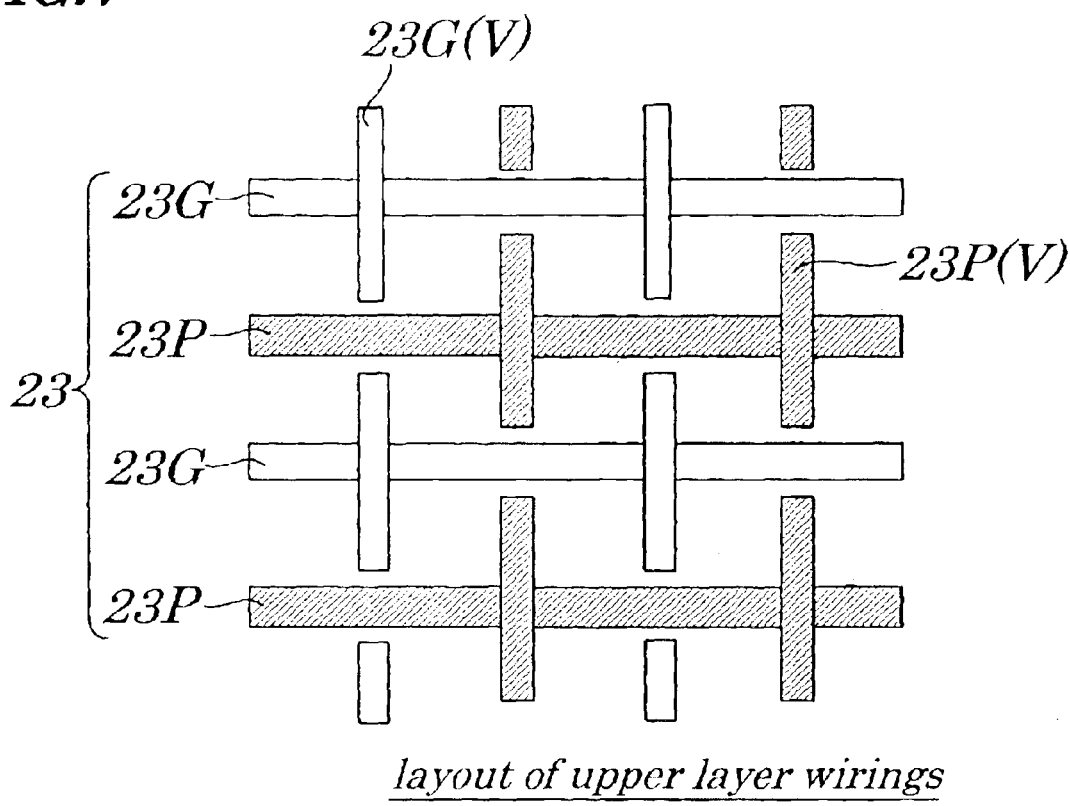
FIG. 7A is a top view showing a layout of a conductive patterns making up a main component of the semiconductor device of the embodiment of the present invention.
Figure 8:
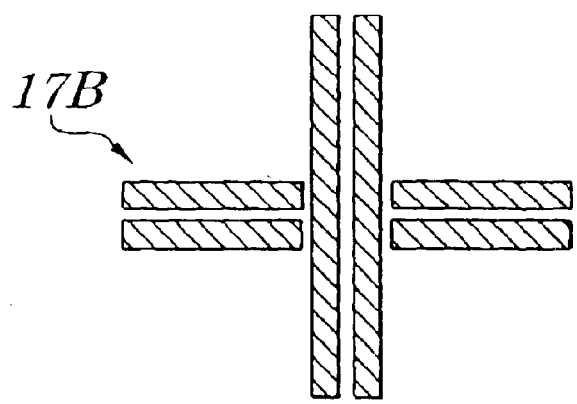
FIG. 8 is a top view showing an example of modifications of a part of the conductive patterns of the embodiment of the present invention.
Figure 9:
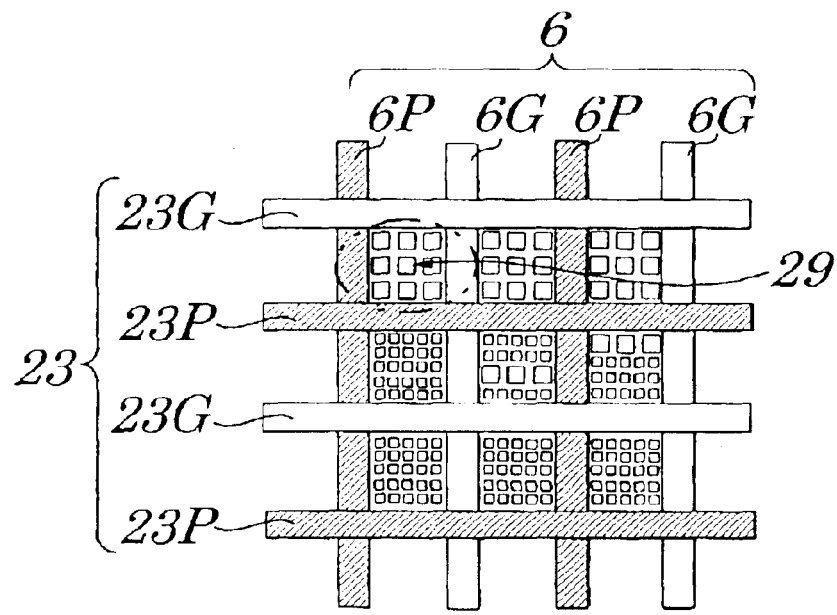
FIG. 9 is a top view schematically showing an example of modifications of arrangement regions of the semiconductor capacitor of the embodiment of the present invention.
Figure 10:
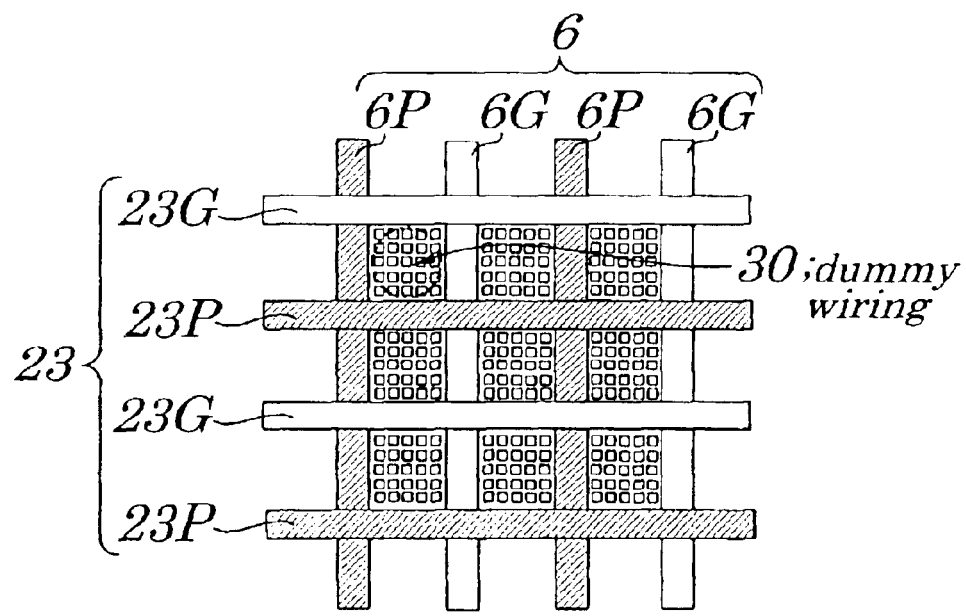
FIG. 10 is a top view schematically showing an example of modifications of arrangement regions of the semiconductor capacitor of the embodiment of the present invention.
Figure 11:
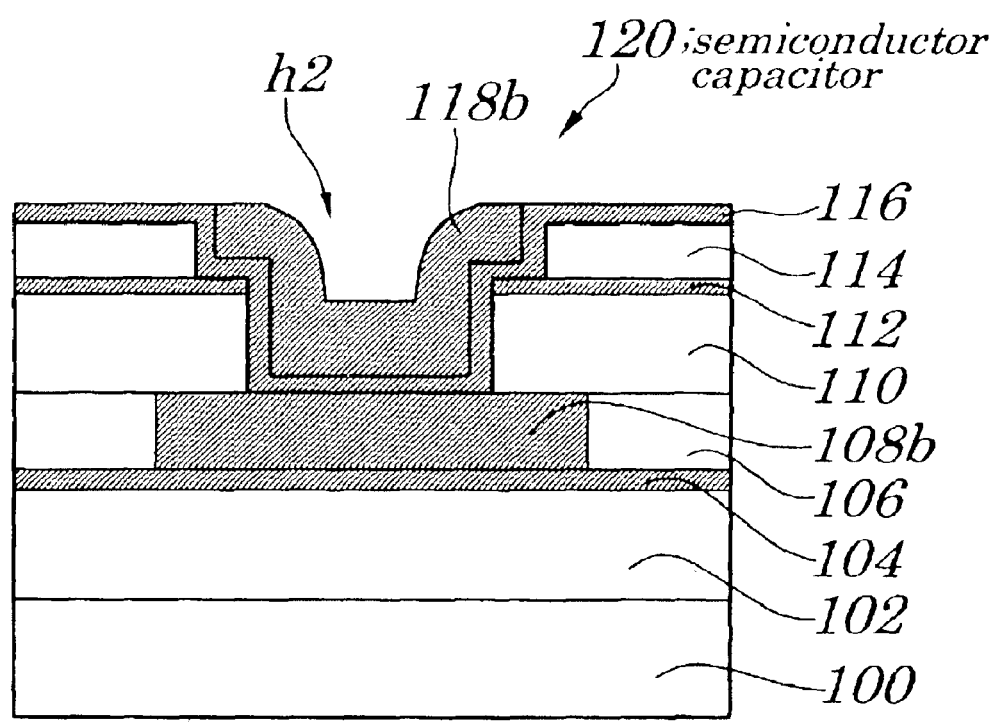
FIG. 11 is a cross-sectional view showing configurations of a conventional semiconductor capacitor.
Figure 12A:
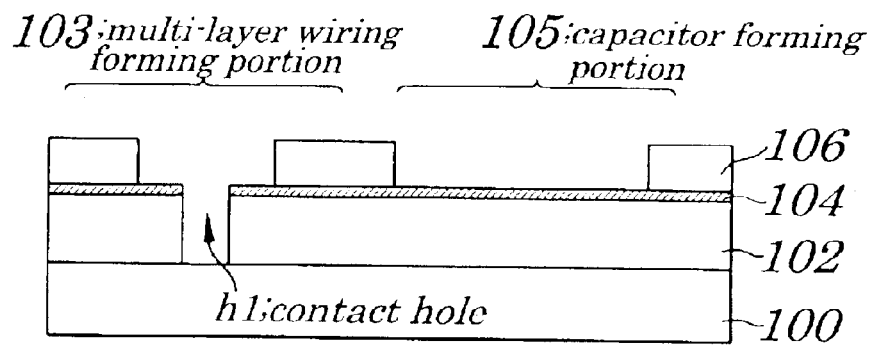
FIGS. 12A, 12B, 12C, 12D and 12E are process diagrams for showing a method of manufacturing the conventional semiconductor capacitor in order of processes.
Figure 12B:
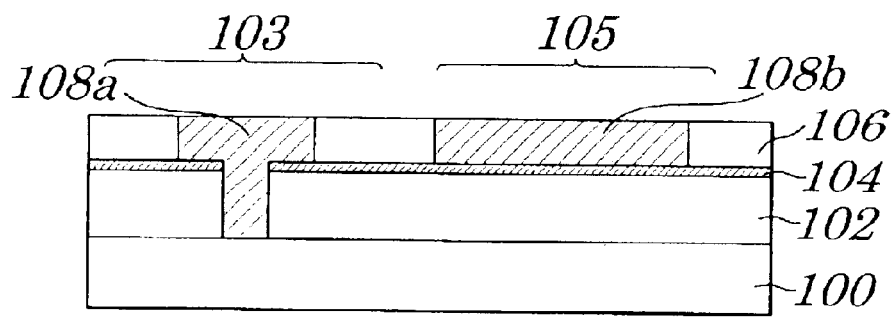
Figure 12C:
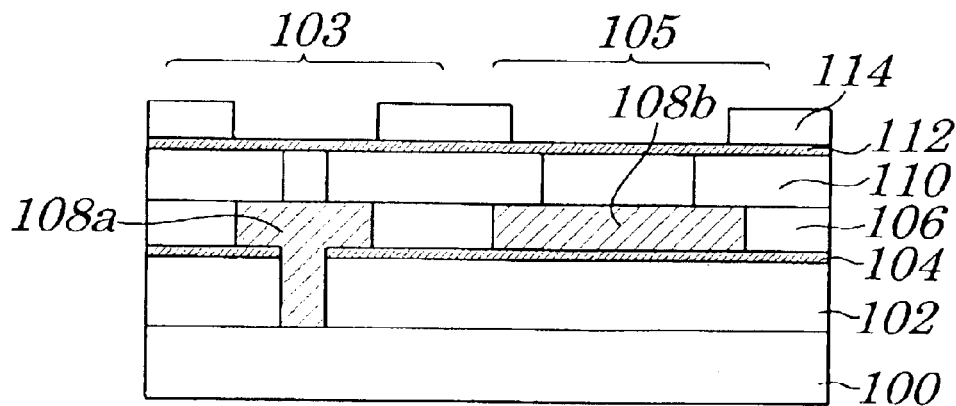
Figure 12D:
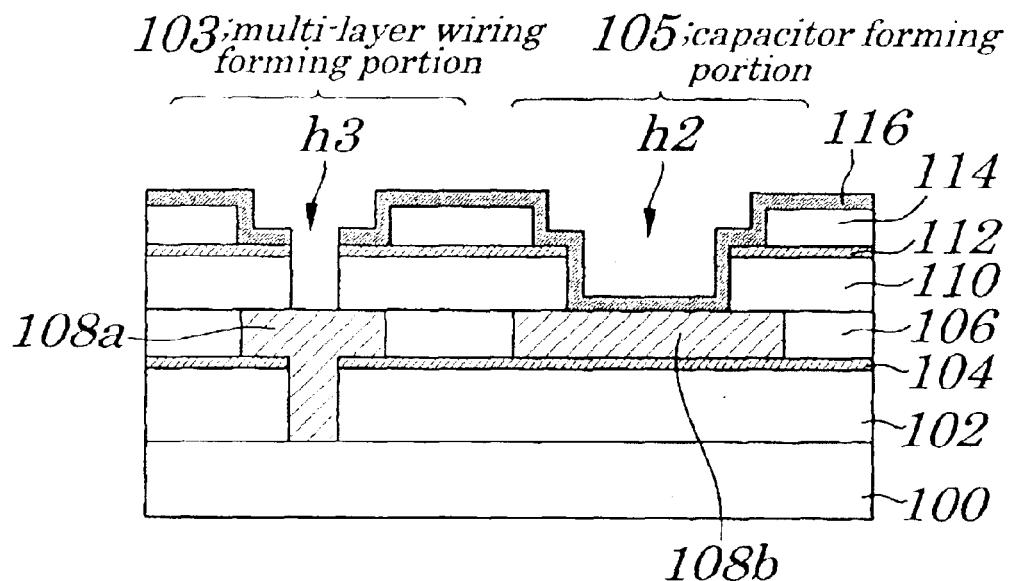
Figure 12E:
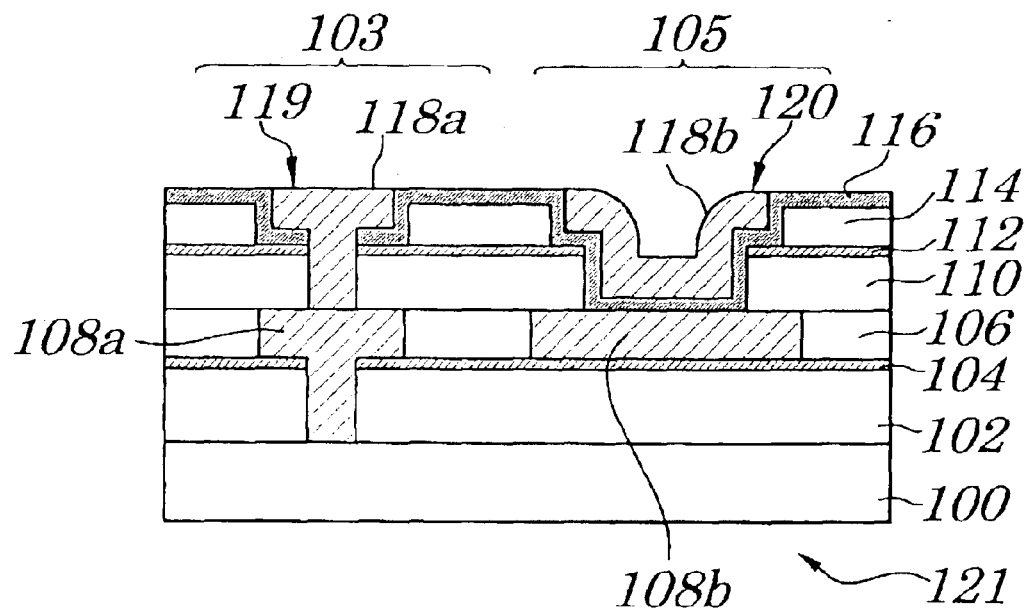
Figure 13:
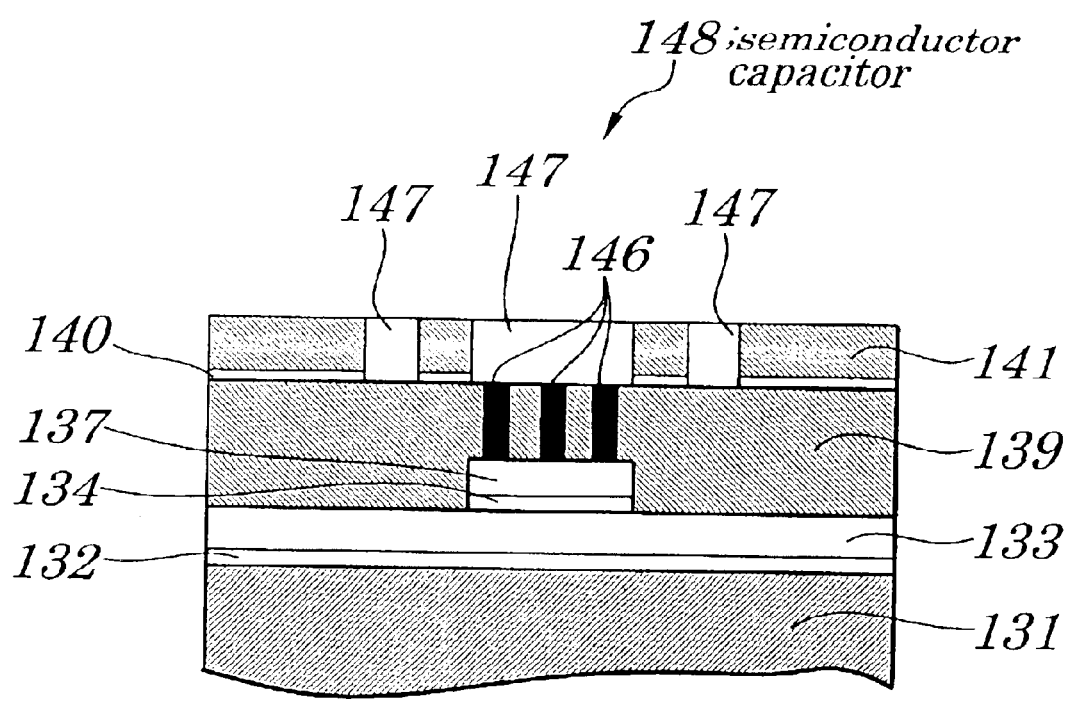
FIG. 13 is a cross-sectional view for illustrating configurations of a conventional semiconductor capacitor.
Figure 14A:
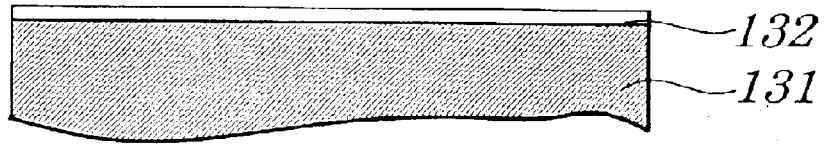
FIGS. 14A, 14B, 14C, 14D, 14E, 14F and 14G are also process diagrams illustrating the method of manufacturing the conventional semiconductor capacitor of FIG. 13 in order of processes.
Figure 14B:
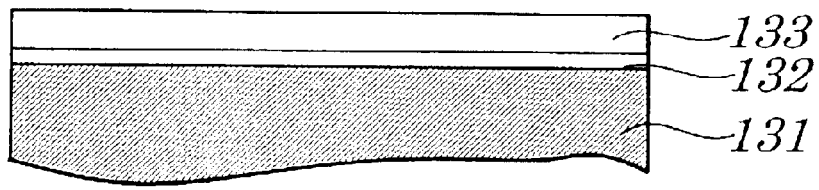
Figure 14C:
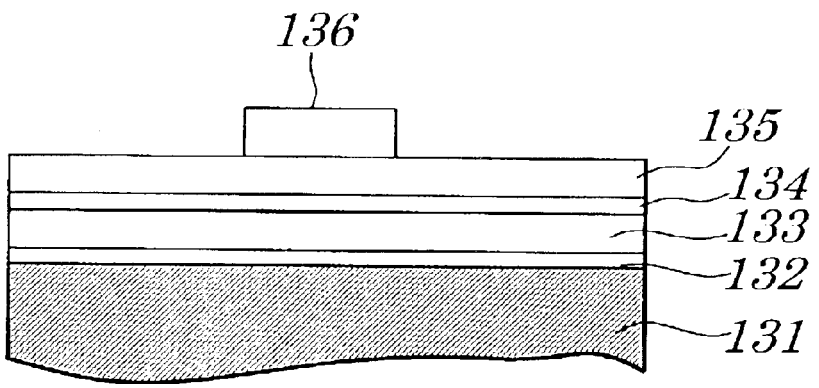
Figure 14D:
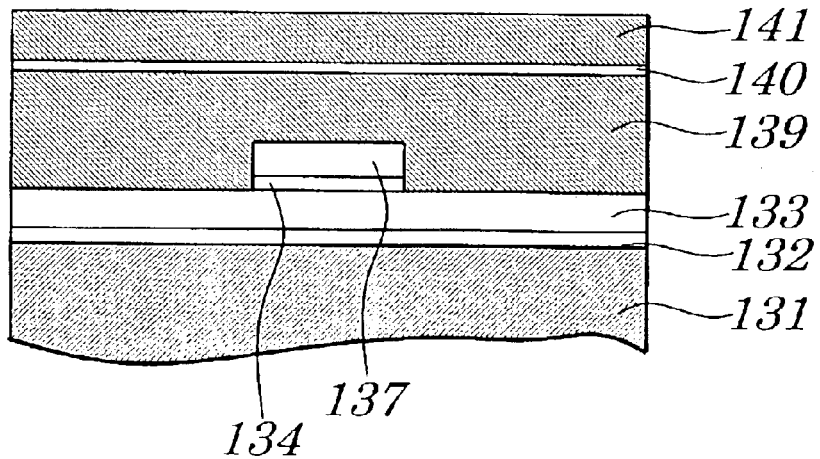
Figure 14E:
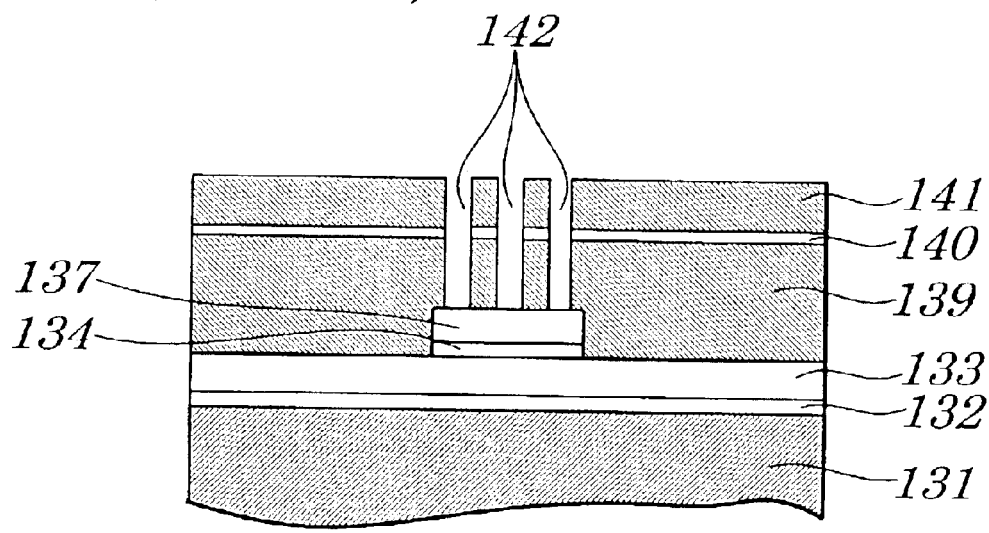
Figure 14F:
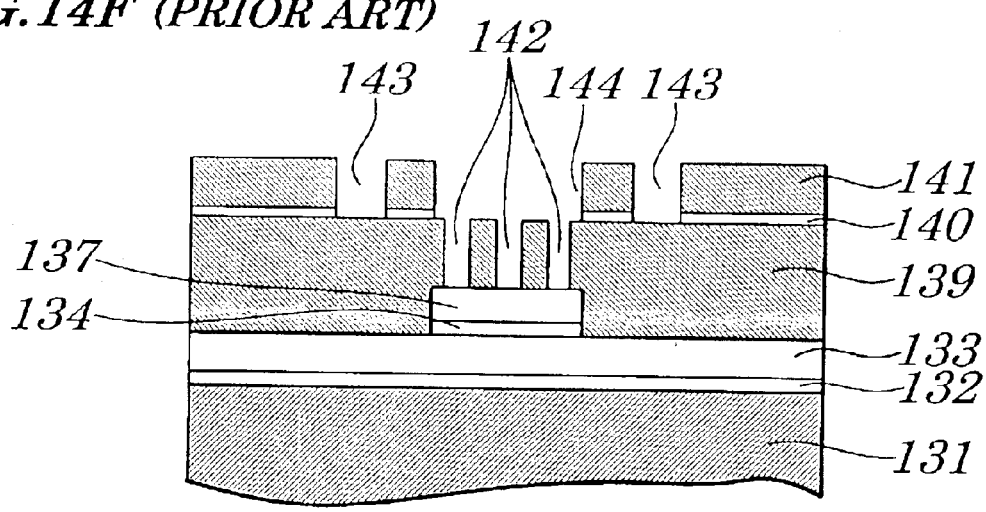
Figure 14G:
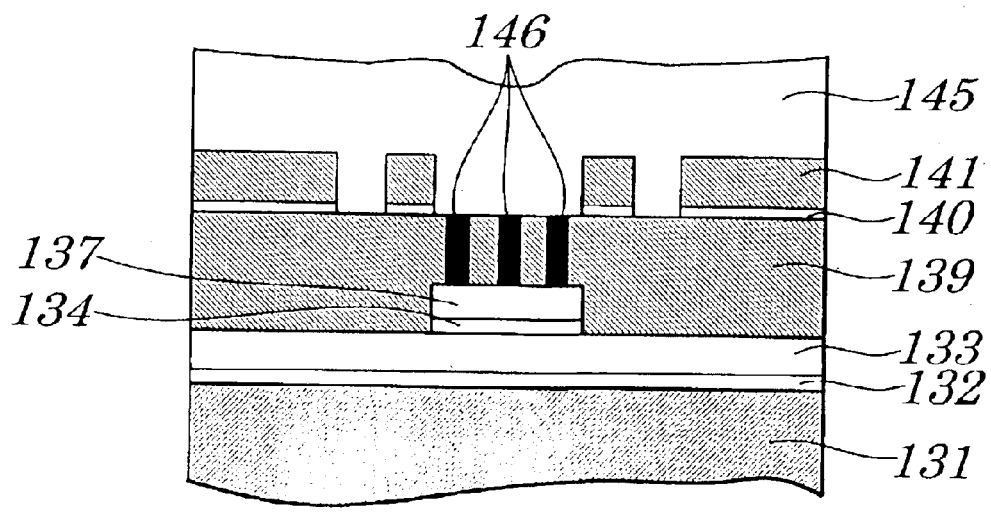

FIG. 1 is a cross-sectional view for showing configurations of a semiconductor capacitor 10 according to a preferable embodiment of the present invention. FIG. 2 is a top view schematically showing configurations of a semiconductor device in which the semiconductor capacitor is formed concurrently with multi-layer wirings according to the embodiment. FIG. 3 is a top view schematically showing configurations of a semiconductor device (as a comparative example) in which the semiconductor capacitor is not formed. FIGS. 4A, 4B, and 4C are process diagrams showing a first method of manufacturing the semiconductor capacitor in order of processes by using a single Damascene wiring method. FIGS. 4D, 4E, and 4F are process diagrams showing the first method of manufacturing the semiconductor capacitor in order of processes by using the single Damascene wiring method. FIGS. 4G, 4H, and 4I are process diagrams showing the first method of manufacturing the semiconductor capacitor in order of processes by using the single Damascene wiring method. FIGS. 5A, 5B, and 5C are process diagrams showing a second method of manufacturing the semiconductor capacitor in order of processes by using a dual Damascene wiring method. FIGS. 5D, 5E, and 5F are process diagrams showing the second method of manufacturing the semiconductor capacitor in order of processes by using the dual Damascene wiring method. FIGS. 6A and 6B are top views showing a layout of conductive patterns making up a main component of the semiconductor device of the embodiment. FIG. 7 is a top view showing a layout of conductive patterns making up a main component of the semiconductor device of the embodiment. FIG. 8 is a top view showing an example of modifications of a part of the conductive patterns of the embodiment of the present invention. FIG. 9 is a top view schematically showing an example of modifications of arrangement regions of the semiconductor capacitor of the embodiment of the present invention. FIG. 10 is a top view schematically showing an example of modifications of arrangement regions of the semiconductor capacitor of the embodiment.

In the semiconductor capacitor 10 of the embodiment of the present invention, as shown in FIG. 1, a first etching stopper film (cap film) 2 made of, for example, a silicon nitride film (SiN), a first interlayer dielectric (lower interlayer dielectric) 3 made of a silicon dioxide film ($SiO_2$), a second etching stopper film 8 made of the SiN film, a second interlayer dielectric (via interlayer dielectric) 9 made of the $SiO_2$ film, a third etching stopper film 19 made up of the SiN film, and a third interlayer dielectric (upper interlayer dielectric) 20 made of $SiO_2$ are sequentially formed on a semiconductor substrate 1 on which transistors, wirings, or a like are formed, in which a lower electrode 6B is formed in a manner that it is buried within a second lower layer wiring trench 4B in the first interlayer dielectric 3, a second via plug 17B serving as an upper electrode is formed through the second etching stopper film 8 on the first interlayer dielectric 3 in a manner that it is buried within a second via hole 16 in the second interlayer dielectric 9 and a capacitive insulating film 13 made up of the above second etching stopper film 8 is formed only in a region being sandwiched between the second via plug 17B and the lower electrode 6B (in a region where the second via plug 17B faces the lower electrode 6B). The second via plug 17B serving as the upper electrode is connected to an upper layer wiring 23B formed in a manner that it is buried within a second upper layer wiring trench 21B in the third interlayer dielectric 20.

The semiconductor capacitor 10 in this embodiment, as described later, when multi-layer wirings are formed using the Damascene wiring method, is manufactured on a common semiconductor substrate concurrently with multi-layer wirings. Moreover, the multi-layer wiring is described in an example in which power source wirings and GND (Ground) wirings are formed.

Next, a first method of manufacturing the semiconductor capacitor 10 is described in order of processes by using the single Damascene wiring method by referring to FIGS. 4A to 4I. First, as shown in FIG. 4A, on the semiconductor substrate 1 on which transistors, wirings, or a like are formed, the first etching stopper film 2 made of, for example, SiN and the first interlayer dielectric 3 made of $SiO_2$ are sequentially formed by a CVD (Chemical Vapor Deposition) method. Here, the first etching stopper film 2 plays a role of acting so that etching is performed with high controllability when the first interlayer dielectric 3 thereon is etched as described later.

Next, as shown in FIG. 4B, by using known photolithography technology, the first interlayer dielectric 3 in a region corresponding to a multi-layer wiring forming portion 11 and the first etching stopper film 2 in a region corresponding to a capacitor forming portion 12 are selectively etched using a photo-resist film as a mask until the semiconductor substrate 1 is exposed to form a first lower layer wiring trench 4A and the second lower layer wiring trench 4B, respectively. Next, after a first wiring film made of a Cu-film having a desired thickness has been formed on all surfaces of the first interlayer dielectric 3 including the first lower layer wiring trench 4A and the second lower layer wiring trench 4B by using a sputtering method and a plating method, the Cu-film is removed by the CMP method until a surface of the first interlayer dielectric 3 is exposed and then the Cu-film is buried into the first wiring trench 4A of the region corresponding to the multi-layer wiring forming portion 11 to form a lower layer wiring 6A and is also buried into the second wiring trench 4B in the region corresponding to the capacitor forming portion 12 to form the lower electrode 6B.

Then, as shown in FIG. 4C, by using the CVD method, the second etching stopper film 8 made of, for example, SiN having a thickness of 5 nm to 50 nm and the second interlayer dielectric 9 made of $SiO_2$ are sequentially formed on all surfaces of the first interlayer dielectric 3, the lower layer wiring 6A, and the lower electrode 6B.

Next, as shown in FIG. 4D, by using a photo-resist film (not shown) formed in the region corresponding to the capacitor forming portion 12 as a mask, the second interlayer dielectric 9 and the second etching stopper film 8 in the region corresponding to the multi-layer wiring forming portion 11 are selectively etched until a surface of the lower layer wiring 6A is exposed to form a first via hole 15.

Then, as shown in FIG. 4E, by using a photo-resist film (not shown) in the region corresponding to the multi-layer wiring forming portion 11 as a mask, the second interlayer dielectric 9 in the region corresponding to the capacitor forming portion 12 is selectively etched until a surface of the second etching stopper film 8 is exposed to form the second via hole 16. In this etching process, the second etching stopper film 8 is kept being left so as to use it as a capacitive insulating film for the semiconductor capacitor 10.

Next, as shown in FIG. 4F, by exposing the semiconductor substrate 1 to an atmosphere of, for example, CF (carbon fluoride) gas such as $CF_4$ (carbon tetrafluoride), $CF_4$—$O_2$ (carbon tetrafluoride-oxygen) $CF_4$—$H_2$ (carbon tetrafluoride-hydrogen), or a like, the second etching stopper film 8 in the region corresponding to the capacitor forming portion 12 is selectively etched so as to reduce its thickness so that it can be used as the capacitive insulating film of the semiconductor capacitor 10. A value of this thickness is selected so that a desired capacity required as the semiconductor capacitor 10 is obtained. As is known, the smaller the thickness of the capacitive insulating film becomes, the larger the capacity of the semiconductor capacitor 10 becomes. Through this etching process, the above second etching stopper film 8 is changed to be a capacitive insulating film 13.

Then, as shown in FIG. 4G, after a second wiring film made of a Cu-film having a desired thickness has been formed on all surfaces of the second interlayer dielectric 9 including the first via hole 15 and the second via hole 16, the Cu-film is removed by using the CMP method until a surface of the second interlayer dielectric 9 is exposed, and a first via plug 17A is formed into the first via hole 15 in the region corresponding to the multi-layer wiring forming portion 11 in a manner that the Cu-film is buried and, at a same time, the second via plug 17B serving as an upper electrode is formed into the second via hole 16 in the region corresponding to the capacitor forming portion 12 in a manner that the Cu-film is buried.

Next, as shown in FIG. 4H, by using the CVD method, the third etching stopper film 19 made of, for example, SiN and the third interlayer dielectric 20 made of $SiO_2$ are sequentially formed.

Then, as shown in FIG. 4I, by using known photolithography technology, the third interlayer dielectric 20 and the third etching stopper film 19 in the region corresponding to the multi-layer wiring forming portion 11 are selectively etched until a surface of the first via plug 17A is exposed, by using a photo-resist film (not shown) as a mask, to form a first upper layer wiring trench 21A and, at a same time, the third interlayer dielectric 20 and the third etching stopper film 19 in the region corresponding to the capacitor forming portion 12 are selectively etched until a surface of the second via plug 17B is exposed, by using the photo-resist film (not shown) as the mask, to form the second upper layer wiring trench 21B. Then, after a third wiring film made of a Cu-film having a desired thickness has been formed on all surfaces of the third interlayer dielectric 20 including the first upper layer wiring trench 21A and the second upper layer wiring trench 21B by using the sputtering method and the plating method, the Cu-film is removed by using the CMP method until a surface of the third interlayer dielectric 20 is exposed, and an upper layer wiring 23A is formed into the first upper layer wiring trench 21A in the region corresponding to the multi-layer wiring forming portion 11 in a manner that the Cu-film is buried and, at a same time, the upper layer wiring 23B is formed into the second upper layer wiring trench 21B in the region corresponding to the capacitor forming portion 12 in a manner that the Cu-film is buried.

Thus, a semiconductor device 26 is manufactured by integrating a multilayer wiring 25 obtained by connecting the lower layer wiring 6A through the first via plug 17A to the upper layer wiring 23A in the region corresponding to the multi-layer wiring forming portion 11 and the semiconductor capacitor 10, as shown in FIG. 1, obtained by having the capacitive insulating film 13 be interposed between the lower electrode 6B and the second via plug (upper electrode) 17B and by connecting the second via plug 17B to the upper layer wiring 23B in the region corresponding to the capacitor forming portion 12. It is, therefore, possible to make the semiconductor capacitor 10 operate as the above-mentioned decoupling capacitor in the semiconductor device 26.

Next, the second method of manufacturing the semiconductor capacitor 10 is described in order of processes by using the dual Damascene wiring method by referring to FIGS. 5A to 5F. First, after approximately same processes as those shown in FIGS. 4A and 4B in the first method of manufacturing the semiconductor capacitor 10 of the embodiment described above have been performed, as shown in FIG. 5A, by using the CVD method, the second etching stopper film 8 made of, for example, SiN having a thickness of 5 to 50 nm, the second interlayer dielectric 9 made of $SiO_2$, the third etching stopper film 19 made of SiN, and the third interlayer dielectric 20 made of $SiO_2$ are sequentially formed on all surfaces of the first interlayer dielectric 3 including the first wiring trench 4A and the second wiring trench 4B.

Next, as shown in FIG. 5B, by using known photolithography technology, the third interlayer dielectric 20 and the third etching stopper film 19 in the region corresponding to the multi-layer wiring forming portion 11 and the third interlayer dielectric 20 and the third etching stopper film 19 in the region corresponding to the capacitor forming portion 12 are selectively etched using a photo-resist film (not shown) as a mask until a surface of the second interlayer dielectric 9 is exposed to form the first upper layer wiring trench 21A and the second upper layer wiring trench 21B, respectively.

Then, as shown in FIG. 5C, using a photo-resist film (not shown) formed in the region corresponding to the capacitor forming portion 12 and a photo-resist film (not shown) formed partially in the region corresponding to the multi-layer forming portion 11 as masks, the second interlayer dielectric 9 and the second etching stopper film 8 in the region corresponding to the multi-layer wiring forming portion 11 are selectively etched until a surface of the lower layer wiring 6A is exposed to form the first via hole 15 so that the first via hole 15 is connected to the first upper layer wiring trench 21A.

Then, as shown in FIG. 5D, using a photo-resist film (not shown) formed in the region corresponding to the multi-layer wiring forming portion 11 and a photo-resist film (not shown) formed partially in the region corresponding to the capacitor forming portion 12 as a mask, the second interlayer dielectric 9 in the region corresponding to the capacitor wiring forming portion 12 are selectively etched until a surface of the second etching stopper film 8 is exposed to form a second via hole 16 so that the second via hole 16 is connected to the second upper layer wiring trench 21B. In this etching process, the second etching stopper film 8 is kept being left so as to use it as a capacitive insulating film.

Next, as shown in FIG. 5E, by exposing the semiconductor substrate 1 to an atmosphere of, for example, CF gas such as $CF_4$, $CF_4$—$O_2$, $CF_4$—$H_2$, or a like, the second etching stopper film 8 of the region corresponding to the capacitor forming portion 12 is selectively etched so as to reduce its thickness so that it can be used as the capacitive insulating film for the capacitor. A value of this thickness is selected so that a desired capacity required as the capacitor is obtained. By this etching process, the second etching stopper film 8 is changed to be the capacitive insulating film 13.

Then, as shown in FIG. 5F, after a fourth wiring film made of a Cu film having a desired thickness has been formed on all surfaces of the third interlayer dielectric 20 including the first via hole 15, the second via hole 16, the first and second upper layer wiring trenches 21A and 21B, the Cu film is removed by the CMP method until a surface of the third interlayer dielectric 20 is exposed, and by burying the Cu film into the first via hole 15 and the first upper layer wiring trench 21A in the region corresponding to the multi-layer wiring forming portion 11 to form the first via plug 17A and the upper layer wiring 23A so that the first via plug 17A and the upper layer wiring 23A can be connected to each other and, at a same time, by burying the Cu film into the second via hole 16 and the second upper layer wiring trench 21B in the region corresponding to the capacitor forming portion 12 to form the second via plug 17B and the upper layer wiring 23B so that the second via plug 17B and the upper layer wiring 23B can be connected to each other and can serve as an upper electrode.

Thus, like in the case of the single Damascene wiring method described above, the semiconductor device 26 is manufactured by integrating the multilayer wiring 25 obtained by connecting the lower layer wiring 6A through the first via plug 17A to the upper layer wiring 23A in the region corresponding to the multi-layer wiring forming portion 11 and the semiconductor capacitor 10, as shown in FIG. 1, obtained by having the capacitive insulating film 13 be interposed between the lower electrode 6B and the second via plug (upper electrode) 17B and by connecting the second via plug 17B to the upper layer wiring 23B in the region corresponding to the capacitor forming portion 12. It is, therefore, possible to make the semiconductor capacitor 10 operate as a decoupling capacitor in the semiconductor device 26.

FIG. 2 is a top view schematically illustrating the semiconductor device 26 described above in which the semiconductor capacitor 10 of the embodiment is embedded. FIG. 3 is a top view schematically illustrating a semiconductor device (comparative example) in which the semiconductor capacitor 10 of the embodiment is not embedded. Generally, in a case where power source wirings or GND wirings are constructed by multi-layer wirings, as shown in FIG. 3, in a first wiring film 6 being arranged in a longitudinal direction and making up a lower layer wiring 6A (not shown) of a multi-layer wiring 25, each of power source wirings 6P and each of GND wirings 6G are alternately placed. Likewise, in a third wiring film 23 being arranged in a horizontal direction and making up upper layer wirings 23A and 23B (not shown) of the multi-layer wiring 25, each of power source wirings 23P and each of GND wirings 23G are alternately placed. The multi-layer wiring 25 is so configured that electrical connection between the power source wiring 6P of the lower layer wiring 6A (not shown) and power source wiring 23P of the upper layer wiring 23A is established in an intersecting position 27P (FIG. 3) by a first via plug 17A (not shown) made up of a second wiring film 17 (described later) and electrical connection between the GND wiring 6G of the lower layer wiring 6A and the GND wiring 23G of the upper layer wiring 23A is established in an intersecting position 27G by the first via plug 17A (not shown) made up of the second wiring film 17 (not shown). Actually, the electrical connection between the upper and lower layer wirings is established with a plurality of via plugs being riveted in both the intersecting positions 27P and 27G.

The semiconductor capacitor 10 of the embodiment, as shown in FIG. 2, is formed in an intersecting position 28 other than the intersecting positions 27P and 27G between the first wiring film 6 and the third wiring film 23. Here, FIG. 1 shows a cross-sectional view of the semiconductor capacitor 10 of FIG. 2 taken along a line A—A. That is, the semiconductor capacitor 10 formed in each of intersecting positions 28 has, as shown in FIGS. 1 and 2, the lower electrode 6B made up of the first wiring film 6 arranged in the longitudinal direction, the second via plug 17B (upper electrode) made up of a second wiring film 17 (described later) being connected to the upper layer wiring 23B made up of the third wiring films 23 arranged in the horizontal direction and being placed straight below the upper layer wiring 23B, and the capacitive insulating film 13 made up of the second etching stopper film 8 formed only in a region where the second via plug 17B faces the lower electrode 6B, that is, formed between the second via plug 17B and the lower electrode 6B.

A main portion of the semiconductor device 26 in which the semiconductor capacitor 10 is embedded is constructed by each of conductive patterns having a layout shown in FIGS. 6A, 6B and 7. FIG. 6A shows conductive patterns of the first wiring film 6 making up the lower electrode 6B in the semiconductor capacitor 10. FIG. 6B shows conductive patterns of the second wiring film 17 making up the second via plug 17B in the semiconductor capacitor 10 of the embodiment. FIG. 7 shows conductive patterns of the third wiring film 23 making up the upper layer wiring 23B in the semiconductor capacitor 10. By overlaying the first wiring film 6, second wiring film 17, and third wiring film 23 sequentially, the semiconductor device 26 as shown in FIG. 2 is constructed. In the power source wiring 6P (H) and GND wiring 6G (H) shown in a horizontal direction in FIG. 6A, the second via plug 17B (H) shown in a horizontal direction in FIG. 6B, and the power source wiring 23P (V) and GND wiring 23G (V) shown in a longitudinal direction, a contrivance is provided to increase a region in which the lower electrode 6B faces the second via plug 17B aiming at increasing a capacity value in the semiconductor capacitor 10. Moreover, when the second via plug 17B serving as an upper electrode is formed, since there is a possibility that burying of the second via plug 17B is insufficient depending on a material of the second wiring film 17, it is desirous that a shape of the second via hole 16 is formed so that it has a layout in which the second via plug 17B is divided to a degree that its sufficient burying characteristic is obtained.

FIG. 9 is a diagram illustrating a configuration in which the semiconductor device 10 of the embodiment is placed in a region 29 surrounded by the first wiring film 6 arranged in a longitudinal direction and the third wiring film 23 arranged in a horizontal direction. When a buried wiring made of a Cu film is formed by using Damascene wiring method, generally, a dummy wiring 30 as shown in FIG. 10 is formed in the above-mentioned region 29 to reduce a dishing or erosion phenomenon easily occurring in the Cu wiring and to uniform a Cu wiring resistance. Therefore, by using the dummy wiring 30 as the lower electrode or the upper electrode, a region in which a semiconductor capacitor is to be formed is not required.

As described above, by providing a contrivance to shapes of the lower electrode and upper electrode of the semiconductor capacitor, an increase in a capacity value is made possible. Moreover, by using the semiconductor capacitor of the embodiment in combination with a MOS (Metal Oxide Semiconductor)—type semiconductor capacitor, it is made possible to increase capacity of the semiconductor capacitor. Furthermore, by also using a dummy wiring region, a semiconductor capacitor can be arranged without occupying too much of the region.

As an example, by using the dummy wiring region, a semiconductor capacitor can be arranged in about 30% of a semiconductor chip region calculated in terms of 0.15 $\mu$m—generation products. Moreover, it is expected that the semiconductor capacitor can provide a capacity value of about 900 nF calculated in terms of 0.15 $\mu$m—generation products. However, when the MOS-type semiconductor capacitor is used, it provides only the capacity value of about 700 nF. Converting conditions are set as follows:

Semiconductor chip size:
   18 mm×18 mm
Capacitor arrangement region:
   10% out of data rate 20% for power source wiring and GND wiring; and
   20% out of data rate 40% for dummy wiring region
Insulating film capacity value:
   $8.3 \times 10^{-3}$ PF/$\mu$m$^2$ at a thickness of the SiN film (dielectric constant being 7.5) being 8 nm.

Thus, according to the semiconductor capacitor 10 of the embodiment, since the capacitive insulating film 13 made up of the etching stopper film 8 being formed only in a region (facing region) sandwiched between the second via plug 17B serving as the upper electrode and the lower electrode 6B is provided and since the capacitive insulating film 13 is not formed in a region other than the facing region, it is possible to suppress occurrence of parasitic capacity. Moreover, according to the first method of manufacturing the semiconductor capacitor using the single. Damascene wiring method of the embodiment, since the first etching stopper film 8 formed in the process in FIG. 4C is etched so as to have a desired thickness in the process in FIG. 4F and is then used as the capacitive insulating film 13, a process of forming the capacitive insulating film 13 is not needed and therefore a number of manufacturing processes does not increase, which enables avoidance of an increase in costs accordingly. Furthermore, according to the second method of manufacturing the semiconductor capacitor using the dual Damascene wiring method of the embodiment, since the first etching stopper film 8 formed in the process in FIG. 5A is etched so as to have a desired thickness in the process in FIG. 5D and is then used as the capacitive insulating film 13, a process of forming the capacitive insulating film 13 is not needed and therefore a number of manufacturing processes does not increase, which enables avoidance of an increase in costs accordingly. Therefore, in the configuration in which buried wirings formed in the interlayer dielectric is used as electrodes, an increase in manufacturing processes can be prevented with occurrence of parasitic capacity being suppressed.

It is apparent that the present invention is not limited to the above embodiments but may be changed and modified without departing from the scope and spirit of the invention. For example, in the above embodiment, as the material for the buried wiring formed by using the Damascene wiring method, the Cu film is used. However, the present invention is not limited to the Cu film and a Cu metal film containing Cu as a main ingredient may be used. Moreover, in the embodiment, when the Cu film is formed in the interlayer dielectric, use of a barrier metal is omitted. However, a barrier metal made up of a single film such as Ti (titanium), TiN (titanium nitride), Ta (tantalum), TaN (tantalum nitride), or a like or a stacked film such as Ti/TiN, Ta/TaN, or a like may be used.

Moreover, by forming the etching stopper film used as the capacitive insulating film so as to have a thickness which can provide a desired capacity value from a first stage, selective etching to reduce a film thickness after the formation of films is made unnecessary. The material for such the etching stopper film is not limited to the SiN shown in the embodiment. $SiO_2$ (silicon dioxide), SiON (silicon oxide nitride), SiC (silicon carbide), SiCN (silicon carbide nitride), or a like may be used. As a material for the via plug serving as the upper electrode of the semiconductor capacitor, Cu or Cu metal film is used in the embodiment, however, W (tungsten) or a like may be also used. The interlayer dielectric that can be used is not limited to $SiO_2$ shown in the embodiment and SiOF (silicon oxide with fluorine) having a low dielectric constant (so-called "low-k"), organic film, or a like may be employed.

What is claimed is:

1. A semiconductor capacitive element using wirings buried in an interlayer dielectric on a semiconductor substrate as electrodes comprising:

a lower electrode being buried in a first interlayer dielectric formed on said semiconductor substrate;

an upper electrode being buried in a second interlayer dielectric formed via an etching stopper film on said first interlayer dielectric; and a capacitive insulating film made up of said etching stopper film being formed only in a region being sandwiched between said upper electrode and said lower electrode.

2. The semiconductor capacitive element according to claim 1, wherein a thickness of said capacitive insulating film is smaller than that of said etching stopper film in said region being sandwiched between said first interlayer dielectric and said second interlayer dielectric.

3. The semiconductor capacitive element according to claim 1, wherein a dielectric constant of said etching stopper film is larger than that of said second interlayer dielectric.

4. The semiconductor capacitive element according to claim 1, wherein a third interlayer dielectric is formed on said second interlayer dielectric and said upper electrode is connected to wirings buried in said third interlayer dielectric.

5. A semiconductor device provided with a semiconductor capacitive element using wirings buried in an interlayer dielectric on a semiconductor substrate as electrodes, said semiconductor capacitive element comprising:

a lower electrode being buried in a first interlayer dielectric formed on said semiconductor substrate;

an upper electrode being buried in a second interlayer dielectric formed via an etching stopper film on said first interlayer dielectric; and a capacitive insulating film made up of said etching stopper film being formed only in a region being sandwiched between said upper electrode and said lower electrode.

6. The semiconductor device according to claim 5, wherein a thickness of said capacitive insulating film is smaller than that of said etching stopper film in said region being sandwiched between said first interlayer dielectric and said second interlayer dielectric.

7. The semiconductor device according to claim 5, wherein a dielectric constant of said etching stopper film is larger than that of said second interlayer dielectric.

8. The semiconductor device according to claim 5, wherein a third interlayer dielectric is formed on said second interlayer dielectric and said upper electrode is connected to wirings buried in said third interlayer dielectric.

* * * * *